United States Patent
Everhardt et al.

(10) Patent No.: US 12,095,470 B2
(45) Date of Patent: Sep. 17, 2024

(54) MEASUREMENT AND CONTROL OF CLOCK SIGNAL PHASES

(71) Applicant: Blue Cheetah Analog Design, Inc., Sunnyvale, CA (US)

(72) Inventors: Paul Everhardt, Sunnyvale, CA (US); Wade Berglund, Danville, CA (US); Matthew Spencer, Pasadena, CA (US); Peter Hermansen, New York, NY (US); Michael Scott, Hudson, MA (US); Elad Alon, Lafayette, CA (US); Eric Naviasky, Ellicott City, MD (US)

(73) Assignee: Blue Cheetah Analog Design, Inc., Sunnyvale, CA (US)

( * ) Notice: Subject to any disclaimer, the term of this patent is extended or adjusted under 35 U.S.C. 154(b) by 204 days.

(21) Appl. No.: 17/941,825

(22) Filed: Sep. 9, 2022

(65) Prior Publication Data

US 2024/0088905 A1 Mar. 14, 2024

(51) Int. Cl.
*H03L 7/099* (2006.01)

(52) U.S. Cl.
CPC ................................. *H03L 7/0991* (2013.01)

(58) Field of Classification Search
CPC ....... H03L 7/0991; H03L 7/097; H03L 7/081; H03L 7/099; H03K 5/14
See application file for complete search history.

(56) References Cited

U.S. PATENT DOCUMENTS

2016/0241249 A1\* 8/2016 Balamurugan ......... H04L 25/03
2020/0106430 A1\* 4/2020 Martin ................. H03L 7/0816

\* cited by examiner

*Primary Examiner* — Jeffrey M Shin
(74) *Attorney, Agent, or Firm* — Chuang Intellectual Property Law; Thomas Chuang

(57) ABSTRACT

Methods and apparatuses for clock signal phase measurement and control are described. In one example, a clock signal phase measurement system includes a reference clock signal line to provide a reference clock signal, a delay line to provide an output clock signal, and a wild clock. The clock signal phase measurement system includes a phase sensor configured to randomly and simultaneously sample the reference clock signal and the output clock signal utilizing the wild clock to obtain a phase data. The phase sensor is further configured to measure from the phase data a phase difference between the reference clock signal and the output clock signal.

20 Claims, 7 Drawing Sheets

400

MEASUREMENT AND CONTROL OF CLOCK SIGNAL PHASES

BACKGROUND OF THE INVENTION

High speed devices in modern electronics may utilize a forwarded clock signal received from a sending device for timing the operations of their internal components. Problematically, as the forwarded clock signal is propagated through the receiver device internal components, an unpredictable time delay is introduced. In addition, the unpredictable time delay may vary based on temperature, process, and voltage. As a result, the internal components of the receiver device may not be synchronized with the forwarded clock signal.

For example, to receive data from the sending device (e.g., a first chip), the receiver device (e.g., a second chip) must have the forwarded clock signal synchronized with the intervals of the incoming data signal. If the clock signal used by the receiving device is out of synchronization, data can be lost or misinterpreted. FIG. 1 illustrates sampling of a data signal 104 in a double data rate (DDR) system utilizing a shifted (i.e., delayed) half rate forwarded clock signal 108 in one example. For example, eight or sixteen channels of data are sent together in the clock forwarded system. Advantageous to clock forwarded systems, most of the jitter on the clock does not affect the integrity of the data link since the same clock is used to receive the data as was used to transmit it.

From a corrupted or misaligned half rate clock signal 106 received from the sending device, the receiver generates the shifted half rate forwarded clock signal 108. The receiver is configured to sample the data signal 104 at times defined by the shifted half rate forwarded clock signal 108 and to provide the sampled data to other circuits. To maximize the accuracy of data sampled by the receiver device, the shifted half rate forwarded clock signal 108 must be shifted so that it is synchronized as closely as possible with the data intervals in the data signal 104. For example, the receiver needs to delay the shifted half rate forwarded clock signal 108 by an amount so that the transition 110 (e.g., the rising edge) is in the middle of the data signals (e.g., the data signal 104). However, the accurate generation of the delay requires a means of measuring the delay precisely.

The inventors have recognized a variety of complications related to clock forwarded systems and the problem of accurately measuring the delay. In many applications, the forwarded clock signal is a low swing differential input clock signal. The low swing differential input clock signal is often small, noisy and distorted from intersymbol interference (ISI) so it may not be directly usable by the receiver. Comparators in the receiver that are used to slice the data signals are often not fast enough to slice a bit and recover in time to slice the next bit in a unit interval (UI) so multiple phases of the clock signal need to be produced and aligned correctly. The required relationships are not simple alignment, requiring precise fractional spacing (e.g. 13/16ths) of a unit interval. Strobe signals that strobe the comparators are full swing, and it is difficult to adjust the full swing strobe signals and the low swing differential input clock signal relative to each other due to the size disparity. Furthermore, the produced output clock signals are often at subharmonic frequencies of the input clock signal and loops can become confused as to which edge is being locked.

FIG. 2 illustrates a prior art system 200 for producing a plurality of delayed output clock signals 202_0, 202_1, 202_2, ..., and 202_N. System 200 utilizes a delay locked loop (DLL) formed from a delay line 206_0, a phase detector 208, and an integrator 210. The DLL receives an input clock signal 212 and is configured to synchronize the input clock signal 212 with the delayed output clock signal 202_0 output from a delay line 206_0. Phase detector 208 compares the input clock signal 212 with the delayed clock output signal 202_0 to generate a comparison signal corresponding to a phase difference between the input clock signal 212 with the delayed clock output signal 202_0. The comparison signal is used to generate a control signal 214 which selects the delay amount of the delay line 206_0.

Prior art system 200 includes scaled delay lines 206_1, 206_2, ..., and 206_N, which output delayed clock signals 202_1, 202_2, ..., and 202_N, respectively. To produce the desired delays for output clock signals 202_1, 202_2, ..., and 202_N, prior art system 200 locks the DLL to the input clock signal 212 and uses the control signal 214 for the delay line 206_0 as a control for the scaled delay lines 206_1, 206_2, ..., and 206_N. The prior art system 200 is disadvantageous because delayed output clock signals 202_1, 202_2, ..., and 202_N are not part of the closed control loop so distribution errors cannot be corrected. Furthermore, the prior art system 200 is reliant on the scaling of delay lines 206_1, 206_2, ..., and 206_N to have sufficient precision for the desired application, which is difficult in modern high speed applications.

As a result, improved methods and apparatuses for measurement and control of clock signal phases are needed.

BRIEF DESCRIPTION OF THE DRAWINGS

The present invention will be readily understood by the following detailed description in conjunction with the accompanying drawings, wherein like reference numerals designate like structural elements.

DESCRIPTION OF SPECIFIC EMBODIMENTS

Figure 1:
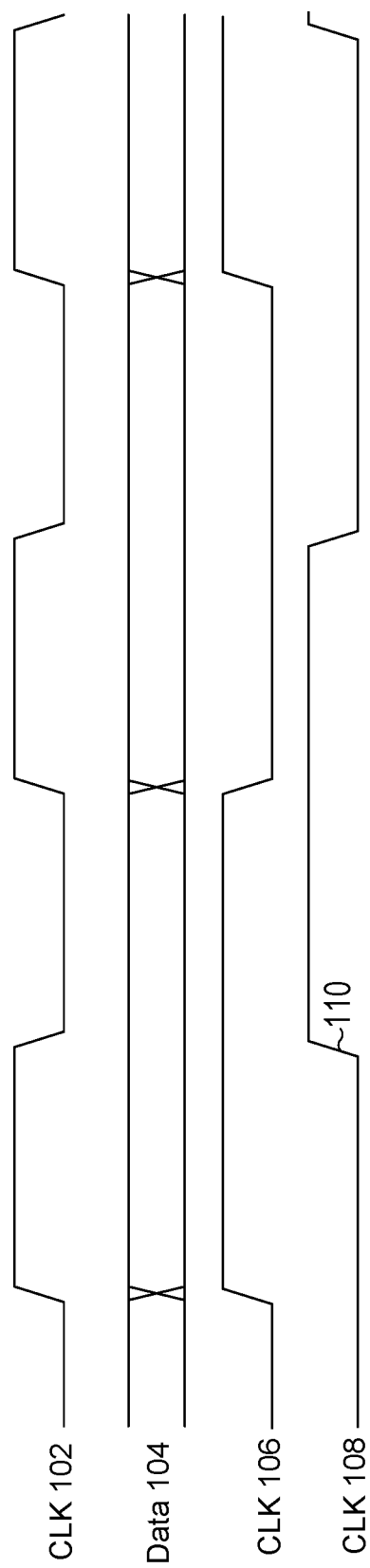
FIG. 1 illustrates sampling of a data signal utilizing a shifted forwarded clock signal in one example.
Figure 2:
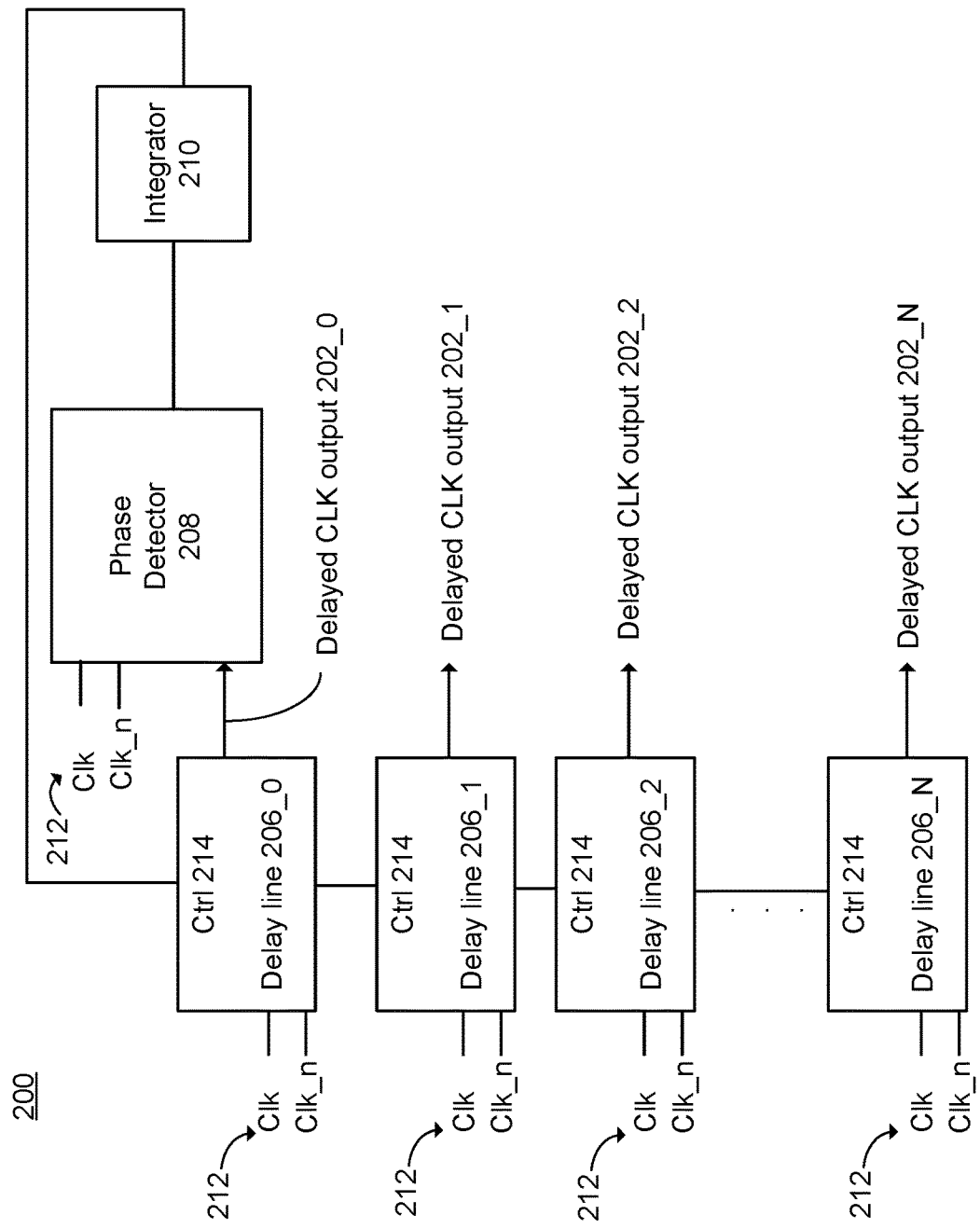
FIG. 2 illustrates a prior art system for producing a plurality of delayed output clock signals.

Methods and apparatuses for measurement and control of clock signal phases are disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein.

In one example embodiment of the invention, a clock signal phase measurement system includes a reference clock signal line to provide a reference clock signal, a delay line to provide an output clock signal, and a wild clock. The clock signal phase measurement system includes a phase sensor configured to randomly and simultaneously sample the reference clock signal and the output clock signal utilizing the wild clock to obtain a phase data. The phase sensor is further configured to measure from the phase data a phase difference (also referred to herein as a phase offset) between the reference clock signal and the output clock signal.

In one example embodiment of the invention, a method for obtaining a phase data includes receiving a reference clock signal, receiving an output clock signal, and receiving a wild clock signal. The method includes obtaining a phase data by randomly and simultaneously sampling the reference clock signal and the output clock signal utilizing the wild clock signal.

In one example embodiment of the invention, a multiphase control system includes a reference clock signal line to provide a reference clock signal, a multiphase delay line to provide a plurality of output clock signals, and a wild clock. The multiphase control system includes a phase sensor configured to randomly and simultaneously sample the reference clock signal and the plurality of output clock signals utilizing the wild clock to obtain a phase data. The multiphase control system further includes a multiphase controller configured to adjust from the phase data a phase of each output clock signal in the plurality of output clock signals.

In one example embodiment of the invention, a method for adjusting multiple phases of a clock signal includes receiving a reference clock signal, receiving a plurality of output clock signals, and receiving a wild clock signal operative at an independent wild clock frequency. The method includes obtaining a phase data, which includes randomly and simultaneously sampling the reference clock signal and the plurality of output clock signals utilizing the wild clock signal. The method further includes adjusting from the phase data a phase for each output clock signal in the plurality of output clock signals.

In one example embodiment of the invention, a multiphase alignment system for a low swing clock forwarded receiver is presented. The system uses a digital DLL to lock a divided clock output to an incoming differential clock using a replica of a data sampler. A reference clock which is a full swing single ended CMOS clock is produced aligned to the incoming differential clock, i.e. a zero delay clock buffer.

This is followed by a wild clock based statistical phase alignment system to precisely measure the fractional unit interval phase offset of multiple output clocks (e.g., N output clock signals, where N=8 or N=16 in non-limiting examples described herein). A control loop includes a wild clock sampling system as a sensor to provide a means to set the phase of the N output clock signals with precise phase offsets relative to the reference clock signal. The N output clock signals are individually delayed to produce the desired precise phase offsets, resulting in N output phases. The wild clock sampling system samples the reference clock and each of the phases simultaneously on a relatively random basis to provide the information for a control algorithm to adjust the phases.

The resolution of the system is a function of the lack of correlation between the wild clock and the data clock and the measurement interval. Advantageously, if they are truly uncorrelated and with sufficient wait time, there is no limit to the resolution. The accuracy is limited by the lack of correlation between the wild clock and the data clock. A rational relationship between the two can lead to quantization error in the result. Noise on the wild clock is not a problem, and in fact helps prevent quantization error. The exact control algorithm can be optimized for various goals such as compute efficiency, speed, or error sigma. The examples described herein are non-limiting and are example choices made for a given application. No requirements are placed on the code versus delay linearity of the delay units since the actual edges are measured. Additional features and advantages of the invention will be set forth in the description that follows, and in part will be apparent from the description, or may be learned by practice of the invention.

Figure 3:
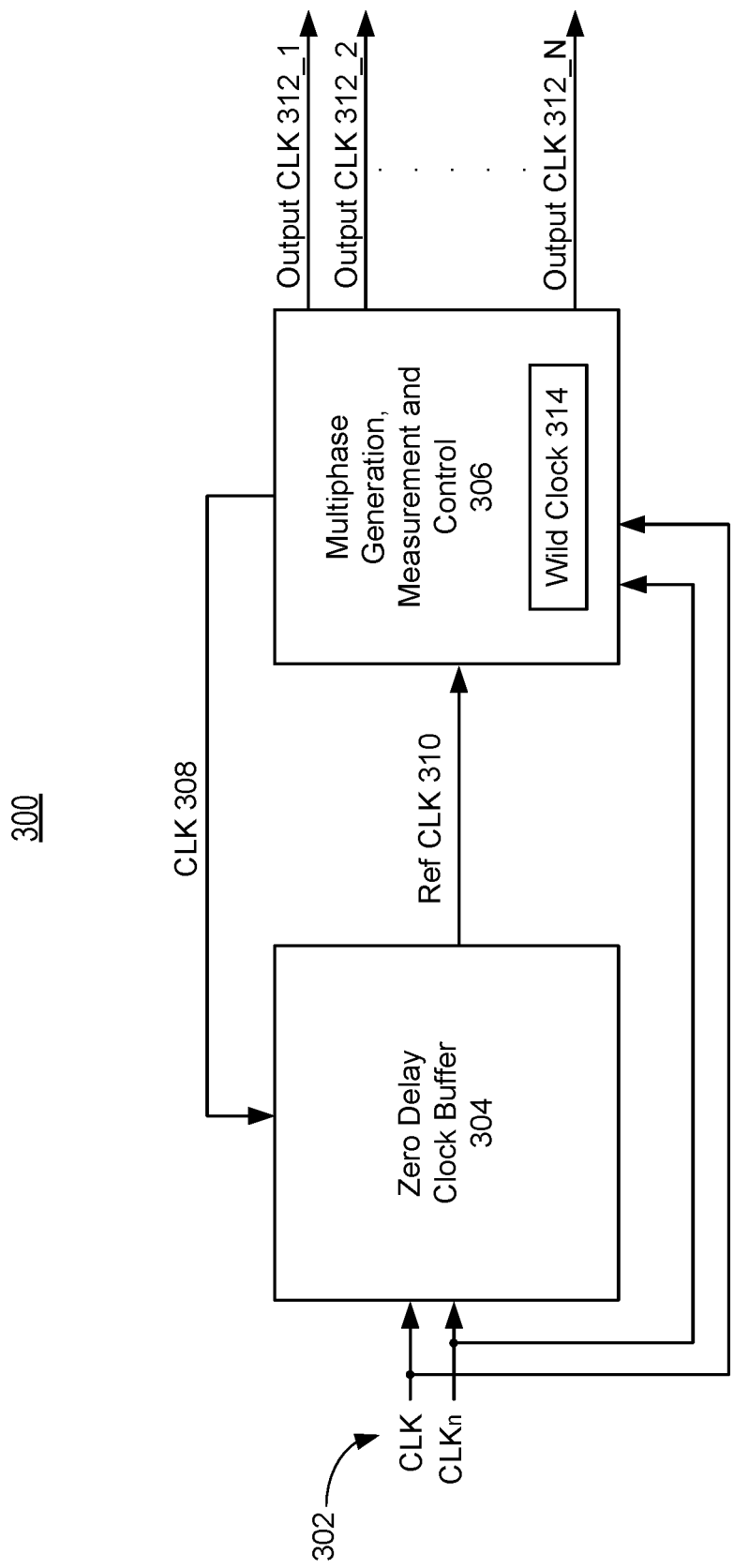
FIG. 3 is a schematic block diagram illustrating a multiphase measurement and control system, in accordance with an embodiment of the invention.

FIG. 3 is a schematic block diagram illustrating a multiphase measurement and control system 300, in accordance with an embodiment of the invention. The multiphase measurement and control system 300 includes a zero delay clock buffer circuit 304 and a multiphase generation, measurement and control circuit 306. The zero delay clock buffer circuit 304 receives an input clock signal 302 forwarded from a data sending device in a clock forwarded system. The zero delay clock buffer circuit 304 generates a reference clock signal 310 from the input clock signal 302. A reference clock signal is a clock signal from which a phase difference of one or more output clock signals is measured. In this particular example, the received input clock signal 302 is a low swing differential signal and the generated reference clock signal 310 is a full swing single ended CMOS clock signal with reduced frequency aligned to the input clock signal 302. In a further example, the input clock signal 302 is a CMOS clock signal which is used as the reference clock signal 310. The multiphase generation, measurement and control circuit 306 generates a clock signal 308 from the input clock signal 302. The zero delay clock buffer circuit 304 receives the clock signal 308 output from the multiphase generation, measurement and control circuit 306.

The multiphase generation, measurement and control circuit 306 receives the reference clock signal 310 and the input clock signal 302. The multiphase generation, measurement and control circuit 306 includes a wild clock 314. The multiphase generation, measurement and control circuit 306 generates a plurality of delayed output clock signals 312_1, 312_2, . . . , and 312_N, where N is the total number of output clock signals. For example, N is equal to sixteen. In a further example, N is equal to eight. Utilizing the wild clock 314, the multiphase generation, measurement and control circuit 306 measures and adjusts the phase of each output clock signal 312_1, 312_2, . . . , and 312_N. For example, the multiphase generation, measurement and control circuit 306 sets the phase of the output clock signals with precise phase offsets relative to the reference clock signal 310 or relative to one another.

Figure 4:
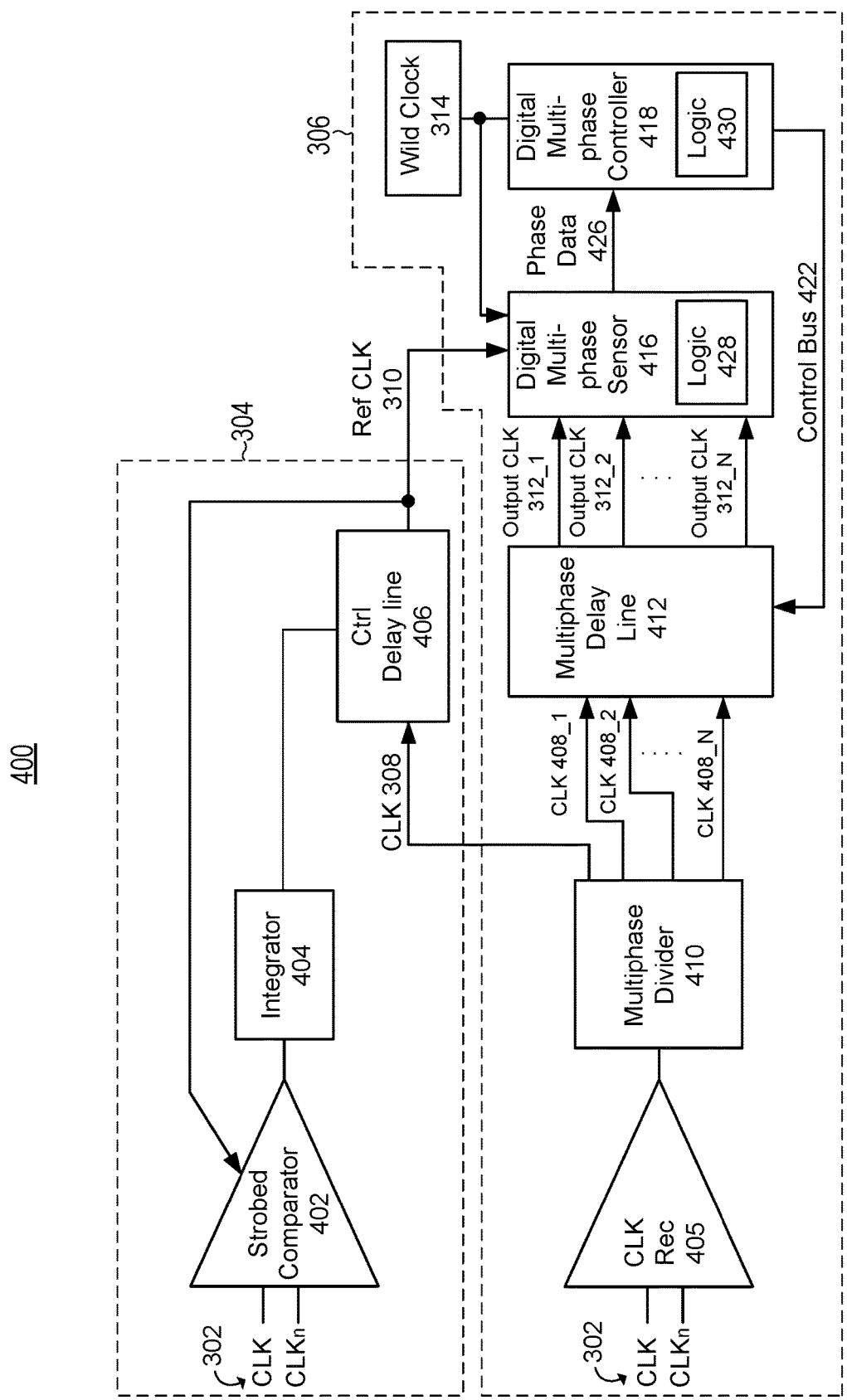
FIG. 4 is a schematic block diagram illustrating the multiphase measurement and control system of FIG. 3, in accordance with an embodiment of the invention.

FIG. 4 is a schematic block diagram illustrating a system 400 implementing the multiphase measurement and control system 300 of FIG. 3, in accordance with an embodiment of the invention. Referring to FIG. 4, in system 400, the zero delay clock buffer circuit 304 includes a strobed comparator 402, an integrator 404, and a delay line 406 operating as a digital delay locked loop (DLL).

The strobed comparator 402 makes a comparison of its input terminals at an instant in time. The output of the strobed comparator 402 is averaged with the integrator 404. At the strobed comparator 402, the input clock signal 302 is sampled with the reference clock signal 310 as close as possible to where the input clock signal 302 is changing, e.g., at the rising edge. The delay line 406 is adjusted to achieve this. If the sampling result is high (i.e., the reference clock signal 310 is higher than the input clock signal 302), a 1 is output and the delay of the reference clock signal 310 is reduced with the delay line 406. If the sampling result is low (i.e., the reference clock signal 310 is lower than the input clock signal 302), a 0 is output and the delay of the reference clock signal 310 is increased with the delay line 406. Although systemic delays in the strobed comparator 402 would count as a systemic error in this isolation section, the systemic error is cancelled since the same strobed comparator 402 is used in the sampling of the data.

In this manner, the zero delay clock buffer circuit 304 locks the reference clock signal 310 to the rising edge of the input clock signal 302, producing a zero delay clock buffer/level shifter from the low swing differential level of the input clock signal 302 to standard CMOS. Changing the polarity of the control function results in the reference clock signal 310 locking to the falling edge of the input clock signal 302. In one example implementation where N=8, the input clock signal 302 operates at 8 GHz for a 16 GB double data rate (DDR) RAM. Eight data slicers for the data operate at 2 GHz and the reference clock signal 310 operates at 2 GHz. In the case of a 32 Gbps data link the same 2 GHz data slicer could be used with 16 phases (i.e., N=16) to recover the data.

The multiphase generation, measurement and control circuit 306 includes a clock receiver 405, a multiphase divider 410, a multiphase delay line 412, the wild clock 314, a digital multiphase sensor 416, and a digital multiphase controller 418. The clock receiver 405 is an analog circuit which receives the input clock signal 302 and outputs a continuous time signal to the multiphase divider 410. The continuous time signal has unpredictable delay, including variation based on temperature, process, and voltage. The multiphase divider 410 includes clock buffers (not shown) to distribute multiple copies of a clock signal, and also introduces unpredictable delay. The multiphase divider 410 outputs clock signal 308 to the delay line 406 and clock signals 408_1, 408_2, . . . , and 408_N to the multiphase delay line 412 also with unpredictable delay.

Clock signals 408_1, 408_2, . . . , and 408_N have staggered phases and frequency equal to 1/N multiplied by the frequency of the input clock signal 302. The multiphase delay line 412 outputs the plurality of delayed output clock signals 312_1, 312_2, . . . 312_N.

The digital multiphase sensor 416 includes multiple flip-flops and receives the reference clock signal 310 and the plurality of delayed output clock signals 312_1, 312_2, . . . 312_N. A reference clock signal line provides the reference clock signal 310 from the zero delay clock buffer circuit 304. The digital multiphase sensor 416 further receives the wild clock 314 signal. The digital multiphase sensor 416 includes detection logic 428 configured to digitally randomly and simultaneously sample the reference clock signal 310 and the plurality of output clock signals 312_1, 312_2, . . . 312_N utilizing the wild clock 314 to obtain a phase data 426. The digital multiphase controller 418 includes control logic 430 configured to adjust from the phase data 426 a phase of each output clock signal in the plurality of output clock signals 312_1, 312_2, . . . 312_N via a control bus 422 between the digital multiphase controller 418 and the multiphase delay line 412. In this manner, the multiphase delay line 412, the multiphase sensor 416, and the multiphase controller 418 form a control loop to obtain and maintain the desired delays.

Wild clock 314 is a clock completely uncorrelated with any other clock. Specifically, there is no cross-correlation function between the wild clock signal and any other clock signals. The wild clock 314 operates at a frequency unrelated to any system clock and the wild clock signal is not aligned with any other signal. Advantageously, this allows for completely random and unbiased sampling of the reference clock signal 310 and output clock signals 312_1, 312_2, . . . 312_N, enabling the digital multiphase sensor 416 to perform an accurate statistical solution measuring the phase data 426. For example, the wild clock 314 is a free running oscillator, such as a free running ring oscillator. In further examples, wild clock 314 is a Stochastic oscillator, or a phase or frequency modulated oscillator with carefully designed modulation waveforms.

Figure 5:
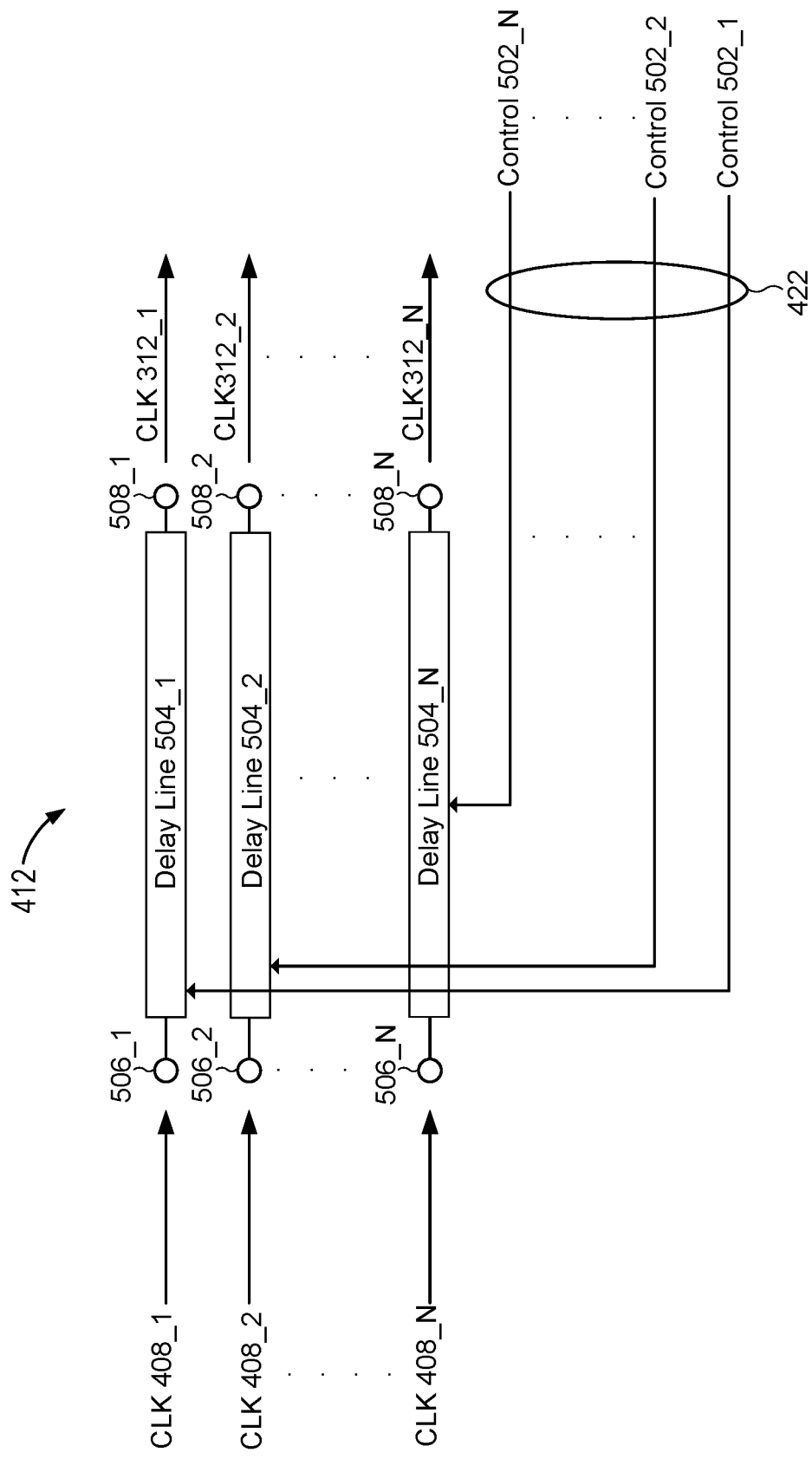
FIG. 5 is a schematic illustration of the multiphase delay line of FIG. 4, in accordance with an embodiment of the invention.

FIG. 5 is a schematic illustration of the multiphase delay line 412 in accordance with an embodiment of the invention. The multiphase delay line 412 includes delay lines 504_1, 504_2, . . . , and 504_N having inputs 506_1, 506_2, . . . , and 506_N, respectively. Each delay line in delay lines 504_1, 504_2, . . . , and 504_N includes a plurality of delay stages for selection of a desired delay. For example, each delay line can include a chain of logic gates. Delay lines 504_1, 504_2, 504c, . . . , and 504_N have outputs 508_1, 508_2, . . . , and 508_N, respectively.

Clock signals 408_1, 408_2, . . . , and 408_N are applied to inputs 506_1, 506_2, . . . , and 506_N, respectively. Delayed output clock signals 312_1, 312_2, . . . , and 312_N are provided at outputs 508_1, 508_2, . . . , and 508_N, respectively. Delay lines 504_1, 504_2, . . . , and 504_N are coupled to control lines 502_1, 502_2, . . . , and 502_N, respectively, on which control signals are received on the control bus 422 from the digital multiphase controller 418, enabling individual selection of the delay to obtain the desired phase for each output clock signal 312_1, 312_2, . . . , and 312_N. Adverse impact of any unpredictable delays is thereby eliminated.

Figure 6:
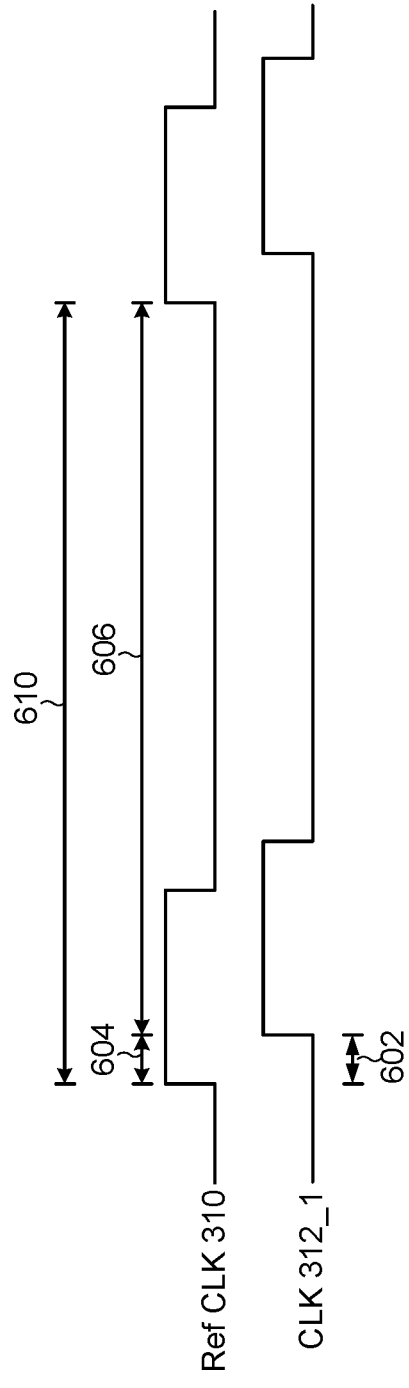
FIG. 6 is a schematic timing diagram of the multiphase measurement and control system of FIG. 4, in accordance with an embodiment of the invention.

FIG. 6 is a schematic timing diagram of the multiphase measurement and control system of FIG. 4, in accordance with an embodiment of the invention. FIG. 6 illustrates operation of the digital multiphase sensor 416 to obtain the phase data 426, in accordance with an embodiment of the invention. The phase data 426 includes a phase difference 602 between the output clock signal 312_1 and the reference clock signal 310.

The digital multiphase sensor 416 digitally samples the reference clock signal 310 and all delayed output clock signals 312_1, 312_2, . . . , and 312_N simultaneously and randomly. By comparing the statistics of the state of the reference clock signal 310 and the delayed output clock signals 312_1, 312_2, . . . , and 312_N, the digital multiphase sensor 416 precisely measures the phase differences in fractions of a unit interval (UI) 610. In the example shown in FIG. 6, the digital multiphase sensor 416 is configured to measure the phase difference 602 by identifying a first condition 604 when the reference clock signal 310 is a high state and the output clock signal 312_1 is a low state, and by identifying a second condition 606 where the first condition 604 is not satisfied.

For example, if random and simultaneous sampling of the reference clock signal 310 and the output clock signal 312_1 shows a ratio of 15:1 for the second condition 606 to the first condition 604, this means the output clock signal 312_1 is delayed by 1/(15+1) or $\frac{1}{16}^{th}$ of a unit interval 610, i.e., the phase difference 602 is $\frac{1}{16}^{th}$ of the unit interval 610. In one example, the unit interval 610 is the period of the reference clock signal 310. In a further example, the unit interval is a subset of a total repeat cycle. If $\frac{1}{16}^{th}$ of the unit interval 610 is the desired phase difference 602, the digital multiphase controller 418 adjusts the delay of the output clock signal 312_1 to maintain this state via a control signal to the delay line 504_1 applied on the control line 502_1. In a similar manner, the phase difference between the reference clock signal 310 and one or more of delayed output clock signals 312_2, . . . 312_N in fractions of the unit interval 610 is measured.

Figure 7:
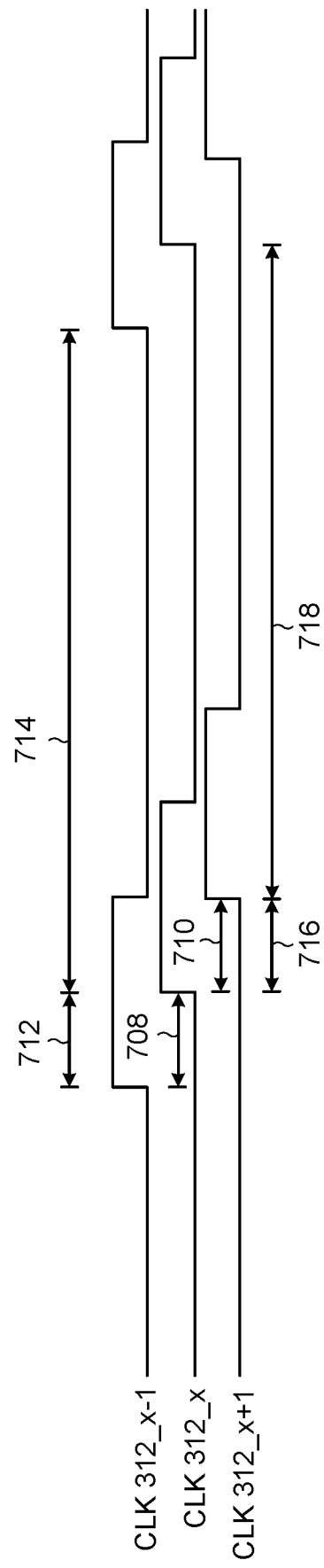
FIG. 7 is a further schematic timing diagram of the multiphase measurement and control system of FIG. 4, in accordance with an embodiment of the invention.

FIG. 7 is a further schematic timing diagram of the multiphase measurement and control system of FIG. 4, in accordance with an embodiment of the invention. FIG. 7 illustrates further operation of the digital multiphase sensor 416 and the digital multiphase controller 418. Shown in FIG. 7 is an alignment process which uniformly spaces the rising edges of the output clock signals 312_1, 312_2, . . . , and 312_N over the period of the reference clock signal 310. The delay of output clock signal 312_1 is measured and adjusted as described above in reference to FIG. 6. The delay of each of the remaining phases of output clock signals 312_2, . . . 312_N is adjusted by comparing the phase difference with the previous phase to the phase difference with the next phase.

For example, the phase data 426 includes a phase difference 708 between an output clock signal 312_x and an output clock signal 312_x−1, and a phase difference 710 between the output clock signal 312_x and an output clock signal 312_x+1. In this example, x may be an integer between two and N−1.

The digital multiphase sensor 416 is configured to measure the phase difference 708 by identifying a first condition 712 when output clock signal 312_x−1 is a high state and the output clock signal 312_x is a low state, and identifying a second condition 714 where the first condition 712 is not satisfied. The digital multiphase sensor 416 is configured to measure the phase difference 710 by identifying a first condition 716 when output clock signal 312_x is a high state and the output clock signal 312_x+1 is a low state, and identifying a second condition 718 where the first condition 716 is not satisfied.

The digital multiphase controller 418 is configured to adjust the delay of output clock signal 312_x so that the phase difference 708 and the phase difference 710 are uniform. The process is repeated across all output phases (i.e., x=2, 3, . . . , N−1) to obtain a uniform phase difference between all output clock signals 312_1, 312_2, . . . , and 312_N.

In various embodiments, the techniques of FIG. 8 discussed below may be implemented as sequences of instructions executed by one or more electronic systems. For example, the instructions may be stored by and executed by the system 300 or system 400.

Figure 8:
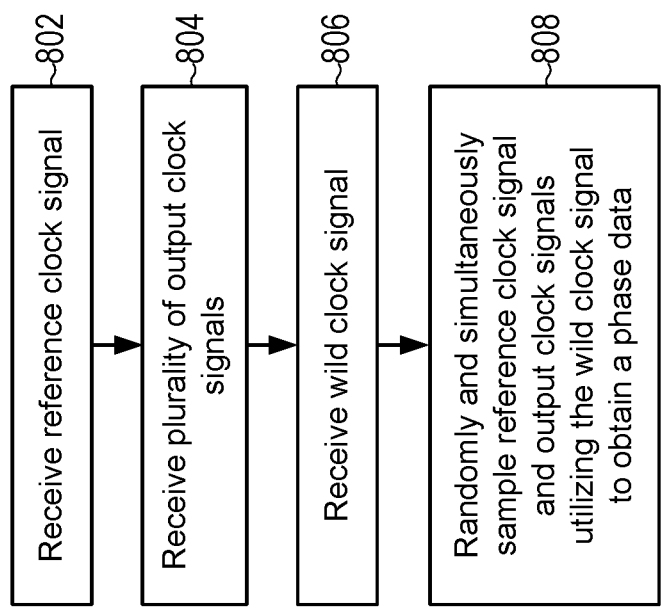
FIG. 8 is a flow diagram illustrating multiphase measurement and adjustment of a plurality of clock signals, in accordance with an embodiment of the invention.

FIG. 8 is a flow diagram illustrating multiphase measurement and control of a plurality of clock signals, in accordance with an embodiment of the invention. At block 802, a reference clock signal is received. In one example, the process includes receiving a low swing differential input clock signal having a low swing differential input clock signal frequency. The reference clock signal is obtained from the low swing differential input clock signal, where the reference clock signal is a full swing single ended signal aligned with the low swing differential input clock signal. The reference clock signal has a reference clock signal frequency less than the low swing differential input clock signal frequency.

At block 804, a plurality of output clock signals are received. In one example, the plurality of output clock signals are obtained from the low swing differential input clock signal, where the plurality of output clock signals have a frequency less than the low swing differential input clock signal frequency. At block 806, a wild clock signal is received.

At block 808, a phase data is obtained by randomly and simultaneously sampling the reference clock signal and the plurality of output clock signals utilizing the wild clock signal. In one example, the obtained phase data includes a first phase difference between a first output clock signal in the plurality of output clock signals and the reference clock signal. The first phase difference between the first output clock signal and the reference clock signal is obtained by identifying a first condition when the reference clock signal is a high state and the first output clock signal is a low state, and identifying a second condition where the first condition is not satisfied.

The phase data further includes a second phase difference between the first output clock signal and a second output clock signal and a third phase difference between the second output clock signal and a third output clock signal, the second output clock signal and the third output clock signal in the plurality of output clock signals. The process further includes adjusting a phase of the second output clock signal so that the second phase difference and third phase difference are uniform. In one example, the process further includes adjusting from the obtained phase data a phase for each output clock signal in the plurality of output clock signals to obtain a uniform phase difference between each output clock signal.

Block diagrams of example systems are illustrated and described for purposes of explanation. The same physical elements which are used to constitute one component may also serve as physical elements of another functional component. The functionality that is described as being performed by a single system component may be performed by multiple components. Similarly, a single component may be configured to perform functionality that is described as being performed by multiple components. For example, the digital multiphase sensor 416 may be combined with the digital multiphase controller 418. For purpose of clarity, details relating to technical material that is known in the technical fields related to the invention have not been described in detail so as not to unnecessarily obscure the present invention. It is to be understood that various example of the invention, although different, are not necessarily mutually exclusive. Thus, a particular feature, characteristic, or structure described in one example embodiment may be included within other embodiments unless otherwise noted.

While the exemplary embodiments of the present invention are described and illustrated herein, it will be appreciated that they are merely illustrative and that modifications can be made to these embodiments without departing from the spirit and scope of the invention. Acts described herein may be implemented as a hardware design. Acts described herein may be computer readable and executable instructions that can be implemented by one or more processors and stored on a computer readable memory or articles. The computer readable and executable instructions may include, for example, application programs, program modules, routines and subroutines, a thread of execution, and the like. In some instances, not all acts may be required to be implemented in a methodology described herein.

Terms such as "component", "module", "circuit", and "system" are intended to encompass software, firmware, hardware, or a combination thereof. For example, a system or component may be a process, a process executing on a processor, or a processor. Furthermore, a functionality, component or system may be localized on a single device or distributed across several devices. The described subject matter may be implemented as an apparatus, a method, or article of manufacture using standard programming or engineering techniques to produce software, firmware, hardware, or any combination thereof to control one or more computing devices.

Thus, the scope of the invention is intended to be defined only in terms of the following claims as may be amended, with each claim being expressly incorporated into this Description of Specific Embodiments as an embodiment of the invention.

What is claimed is:

1. A clock signal phase measurement system comprising:
   a reference clock signal line to provide a reference clock signal;
   a delay line to provide an output clock signal;
   a wild clock; and
   a phase sensor configured to:
      randomly and simultaneously sample the reference clock signal and the output clock signal utilizing the wild clock to obtain a phase data; and
      measure from the phase data a phase difference between the reference clock signal and the output clock signal.

2. The clock signal phase measurement system of claim 1, wherein the phase sensor is configured to measure the phase difference between the reference clock signal and the output clock signal comprising by identifying a first condition when the reference clock signal is a high state and the output clock signal is a low state and identify a second condition where the first condition is not satisfied.

3. The clock signal phase measurement system of claim 1, wherein the wild clock comprises a free running oscillator.

4. The clock signal phase measurement system of claim 1, wherein the phase difference comprises a fractional unit interval.

5. A multiphase control system comprising:
   a reference clock signal line to provide a reference clock signal;
   a multiphase delay line to provide a plurality of output clock signals;
   a wild clock;
   a phase sensor configured to randomly and simultaneously sample the reference clock signal and the plurality of output clock signals utilizing the wild clock to obtain a phase data; and
   a multiphase controller configured to adjust from the phase data a phase of each output clock signal in the plurality of output clock signals.

6. The multiphase control system of claim 5, wherein the phase data comprises a first phase difference between a first output clock signal in the plurality of output clock signals and the reference clock signal.

7. The multiphase control system of claim 6, wherein the phase sensor is configured to measure the first phase difference between the first output clock signal and the reference clock signal by identifying a first condition when the reference clock signal is a high state and the first output clock signal is a low state and identifying a second condition where the first condition is not satisfied.

8. The multiphase control system of claim 6, wherein the phase data further comprises a second phase difference between a second output clock signal and the first output clock signal and a third phase difference between the second output clock signal and a third output clock signal, the second output clock signal and the third output clock signal in the plurality of output clock signals.

9. The multiphase control system of claim 8, wherein the multiphase controller is configured to adjust a second output clock signal phase so that the second phase difference and the third phase difference are uniform.

10. The multiphase control system of claim 5, wherein the wild clock comprises a free running oscillator.

11. The multiphase control system of claim 5, wherein the multiphase controller is configured to adjust from the phase data the phase of each output clock signal in the plurality of output clock signals to obtain a uniform phase difference between each output clock signal in the plurality of output clock signals.

12. The multiphase control system of claim 5, wherein the phase of each output clock signal comprises a fractional unit interval.

13. A method comprising:
    receiving a reference clock signal;
    receiving a plurality of output clock signals;
    receiving a wild clock signal; and
    obtaining a phase data comprising randomly and simultaneously sampling the reference clock signal and the plurality of output clock signals utilizing the wild clock signal.

14. The method of claim 13, wherein the phase data comprises a first phase difference between a first output clock signal in the plurality of output clock signals and the reference clock signal.

15. The method of claim 14, wherein the first phase difference between the first output clock signal and the reference clock signal is obtained by identifying a first condition when the reference clock signal is a high state and the first output clock signal is a low state and identifying a second condition where the first condition is not satisfied.

16. The method of claim 14, wherein the phase data further comprises a second phase difference between the first output clock signal and a second output clock signal and a third phase difference between the second output clock signal and a third output clock signal, the second output clock signal and the third output clock signal in the plurality of output clock signals.

17. The method of claim 16, further comprising adjusting a phase of the second output clock signal so that the second phase difference and third phase difference are uniform.

18. The method of claim 13, further comprising adjusting from the phase data a phase for each output clock signal in the plurality of output clock signals.

19. The method of claim 18, wherein adjusting from the phase data the phase for each output clock signal in the plurality of output clock signals comprises obtaining a uniform phase difference between each output clock signal in the plurality of output clock signals.

20. The method of claim 13, further comprising:
    receiving a low swing differential input clock signal having a low swing differential input clock signal frequency;
    obtaining the reference clock signal from the low swing differential input clock signal, wherein the reference clock signal is a full swing single ended signal aligned with the low swing differential input clock signal, and wherein the reference clock signal has a reference clock signal frequency less than the low swing differential input clock signal frequency; and obtaining the plurality of output clock signals from the low swing differential input clock signal, wherein the plurality of output clock signals have a frequency less than the low swing differential input clock signal frequency.

\* \* \* \* \*